United States Patent
Liang et al.

(10) Patent No.: US 11,387,291 B2
(45) Date of Patent: Jul. 12, 2022

(54) PHOTOELECTRIC SENSOR, DISPLAY PANEL AND MANUFACTURING METHOD THEREOF

(71) Applicant: BOE Technology Group Co., Ltd., Beijing (CN)

(72) Inventors: Shuang Liang, Beijing (CN); Yingwei Liu, Beijing (CN); Zhanfeng Cao, Beijing (CN); Zhiwei Liang, Beijing (CN); Muxin Di, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 358 days.

(21) Appl. No.: 16/605,493

(22) PCT Filed: Apr. 28, 2019

(86) PCT No.: PCT/CN2019/084837
§ 371 (c)(1),
(2) Date: Oct. 15, 2019

(87) PCT Pub. No.: WO2020/038013
PCT Pub. Date: Feb. 27, 2020

(65) Prior Publication Data
US 2021/0408168 A1     Dec. 30, 2021

(30) Foreign Application Priority Data
Aug. 20, 2018  (CN) .......................... 201810949871.6

(51) Int. Cl.
*H01L 27/32*       (2006.01)
*H01L 41/113*     (2006.01)

(52) U.S. Cl.
CPC ...... *H01L 27/3227* (2013.01); *H01L 27/3232* (2013.01); *H01L 27/3246* (2013.01); *H01L 41/1132* (2013.01); *H01L 2227/323* (2013.01)

(58) Field of Classification Search
CPC ............. H01L 27/3227; H01L 27/3232; H01L 27/3246; H01L 27/3225; H01L 27/20; H01L 41/22; H01L 41/47; H01L 41/1132; H01L 41/1134; H01L 41/1136; B81B 3/0029; B81B 3/0032; G06K 9/00006; G06K 9/0004
See application file for complete search history.

(56) References Cited

U.S. PATENT DOCUMENTS 8,901,802 B1 * 12/2014 Que ...................... H02N 2/186
                                                       310/339

FOREIGN PATENT DOCUMENTS

| CN | 105428519 A | 3/2016 | |
| CN | 105760006 A | 7/2016 | |
| CN | 105989335 A | 10/2016 | |
| CN | 106096595 A | * 11/2016 | ........... G06F 3/0421 |

(Continued)

OTHER PUBLICATIONS

CN2018109498716—OA1.
CN2018109498716—OA1—EN.
PCTCN2019084837—ISR.

*Primary Examiner* — Eduardo A Rodela
(74) *Attorney, Agent, or Firm* — IPro, PLLC

(57) ABSTRACT

Disclosed herein is a photoelectric sensor, display panel and their manufacturing method. The photoelectric sensor may comprise a photodeformable unit and a piezoelectric unit in contact with the photodeformable unit.

16 Claims, 22 Drawing Sheets

(56) References Cited

FOREIGN PATENT DOCUMENTS

| | | | | |
|---|---|---|---|---|
| CN | 106192452 A | * | 12/2016 | ............... D01D 5/06 |
| CN | 107122076 A | * | 9/2017 | ............. G06F 3/041 |
| CN | 107122076 A | | 9/2017 | |
| CN | 107316624 A | | 11/2017 | |
| CN | 108052930 A | | 5/2018 | |
| CN | 108899353 A | | 11/2018 | |
| CN | 109103226 A | | 12/2018 | |
| WO | 2020038013 A1 | | 2/2020 | |

* cited by examiner

PHOTOELECTRIC SENSOR, DISPLAY PANEL AND MANUFACTURING METHOD THEREOF

TECHNICAL FIELD

The disclosure herein relates to technical field of semiconductor, particularly relates to a photoelectric sensor, a display panel and a method for making them.

BACKGROUND

A photoelectric sensor mainly uses photoelectric effect to convert optical signal to electric signal. Rapid progress has been made in photoelectric sensors since photoelectric effect was discovered. Currently, photoelectric sensors are widely used in various industries.

SUMMARY

Disclosed herein is a photoelectric sensor comprising: a photodeformable unit; and a piezoelectric unit in contact with the photodeformable unit.

According to an embodiment, the piezoelectric unit comprises a first electrode, a second electrode and a piezoelectric component between the first electrode and the second electrode. The photodeformable unit deforms in response to incident light and generates pressure on the piezoelectric unit and causes the piezoelectric unit to generate electrical signal(s).

According to an embodiment, the photodeformable unit comprises cross-linked liquid crystal macromolecules.

Disclosed herein is a display panel, comprising a plurality of the photoelectric sensors. The display panel further comprises one or more light emitters on the substrate. The plurality of photoelectric sensors are configured to receive light emitted from the one or more light emitters and reflected from an object to perform an object surface pattern detection.

According to an embodiment, the display panel further comprises: a first film layer having a plurality of hollow areas; and a second film layer having a plurality of grooves, each groove of the second film layer opening into a respective hollow area of the first film layer. The photodeformable unit and a first portion of the piezoelectric unit of each photoelectric sensor of the plurality of the photoelectric sensors are located in a respective groove of the second film layer with a second portion of the piezoelectric unit sandwiched between the first film layer and the second film layer.

According to an embodiment, the first portion of the piezoelectric unit of each photoelectric sensor has no direct physical contact with the second film layer and the first film layer; and the photodeformable unit has no direct physical contact with the second film layer and the first film layer.

According to an embodiment, the display panel further comprises a plurality of first thin-film transistors each having a drain or source coupled to one of the plurality of piezoelectric units by one of a plurality of via holes of the first film layer.

According to an embodiment, the display panel further comprises a plurality of second thin-film transistors each coupled to a respective light emitter of the one or more light emitters.

According to an embodiment, the display panel further comprises a third film layer on top of the second film layer. The second film layer further comprises a plurality of through holes each opening into a respective groove of the second film layer, and the third film layer comprises a plurality of protrusions each filling a respective through hole of the second film layer.

According to an embodiment, the plurality of first thin-film transistors and the plurality of second thin-film transistors are formed on a same layer on the substrate.

According to an embodiment, the plurality of first thin-film transistors and the plurality of second thin-film transistors are formed between the first film layer and the substrate.

According to an embodiment, each of the one or more light emitters has an anode on top of the third film layer and the display panel further comprises a pixel define layer dispersed around the anode of each of the one or more light emitters.

According to an embodiment, the pixel define layer between two adjacent anodes having an orthographic projection on the substrate that at least partially overlaps with an orthographic projection of the photodeformable unit of one of the plurality of photoelectric sensors on the substrate.

Disclosed herein is a method of making a display panel, comprising: forming a piezoelectric unit on a substrate, and forming a photodeformable unit on top of and in contact with the piezoelectric unit.

According to an embodiment, the method further comprises: forming a first thin-film transistor on the substrate; forming a first film layer on a surface of the first thin-film transistor away from the substrate; forming a first via hole, a second via hole and a hollow area on the first film layer; and forming a first sacrifice layer at the hollow area. The piezoelectric unit is formed partially on top of the first film layer and partially on top of the first sacrifice layer.

According to an embodiment, forming the piezoelectric unit on the substrate further comprises: forming a first electrode partially on top of the first film layer and partially on top of the first sacrifice layer, the first electrode being electrically coupled to a drain or source of the first thin-film transistor via the first via hole; forming a piezoelectric component partially on top of the first electrode and partially on top of the first film layer; and forming a second electrode on top of the piezoelectric component, the second electrode being electrically coupled to an electric contact at a same layer of the first thin-film transistor via the second via hole. The photodeformable unit is formed on top of the second electrode.

According to an embodiment, the method further comprises: forming a second sacrifice layer covering the photodeformable unit and in contact with the first sacrifice layer; forming a second film layer on top of the second sacrifice layer, the first film layer, the photodeformable unit and the piezoelectric unit; forming a through hole in the second film layer in connection to the second sacrifice layer; removing the first sacrifice layer and the second sacrifice layer by injecting a solution in the through hole; and forming a third film layer to cover the second film layer and block the through hole.

According to an embodiment, the method further comprises: forming a second thin-film transistor on top of the substrate when forming the first thin-film transistor; forming a third via hole on the first film layer on top of a source or drain of the second thin-film transistor; forming a fourth via hole on the second film layer in connection to the third via hole; forming a fifth via hole on the third film layer in connection to the fourth via hole; forming an anode on top of the third film layer and electrically coupled to the source or drain of the second thin-film transistor via the third, fourth and fifth via holes.

According to an embodiment, the method further comprises: forming a pixel define layer dispersed around the anode. The pixel define layer having an orthographic projection on the substrate that at least partially overlaps with an orthographic projection of the photodeformable unit on the substrate.

DETAILED DESCRIPTION

Figure 1:
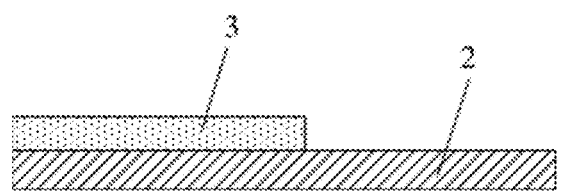
FIG. 1 schematically shows a structural diagram of a photoelectric sensor, according to an embodiment.

As shown in FIG. 1, a photoelectric sensor is disclosed herein, according to an embodiment. The photoelectric sensor comprises a piezoelectric unit 2, and a photodeformable unit 3 on top of the Piezoelectric unit 2. The photodeformable unit is in contact with at least part of the piezoelectric unit. Here, the photodeformable unit 3 deforms when being irradiated by light, causing the piezoelectric unit 2 to deform, so that an electrical signal is generated.

According to an embodiment, the photoelectric sensor comprises a piezoelectric unit, and a photodeformable unit in contact with the piezoelectric unit. Further, when incident light strikes on the photodeformable unit, the photodeformable unit deforms. Because the piezoelectric unit is in contact with the photodeformable unit, when the photodeformable unit deforms, the piezoelectric unit deforms. An electric signal may be generated when the piezoelectric unit deforms. Therefore, a light signal can be converted into an electrical signal.

Figure 2:
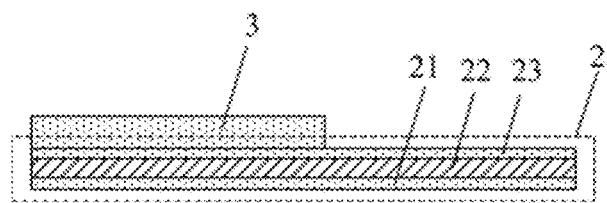
FIG. 2 schematically shows a specific structural diagram of a photoelectric sensor, according to an embodiment.

The piezoelectric unit 2 is shown in FIG. 2, according to an embodiment. The piezoelectric unit 2 may specifically comprise a first electrode 21, a piezoelectric component 22 located on the first electrode 21, and a second electrode 23 located on the piezoelectric component 22. The piezoelectric component 22 may be a piezoelectric film layer 22 in an embodiment and generates an electric signal when the piezoelectric film layer 22 deforms. The first electrode 21 and the second electrode 23 conduct the generated electric signal to an external circuit.

Figure 3:
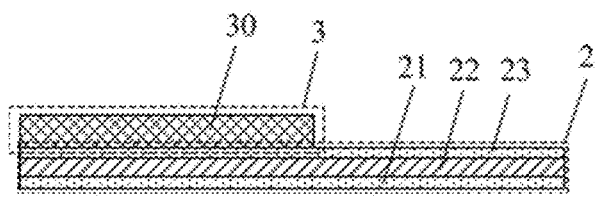
FIG. 3 schematically shows another specific structural diagram of a photoelectric sensor, according to an embodiment.

The photodeformable unit 3 is shown in FIG. 3, according to an embodiment. The photodeformable unit 3 comprises a photodeformable film layer 30. The photodeformable film layer 30 deforms when being irradiated by light. Optionally, the material of the photodeformable layer 30 is cross-linked liquid crystal macromolecules, which may also be referred to as cross-lined liquid-crystalline polymers (CLCP). Liquid crystal is a physical state between solid state and liquid state. Liquid crystal molecules may be divided into small molecule liquid crystals and liquid crystal macromolecules (or liquid crystal polymers), according to the molecular weight. CLCP may be a kind of liquid crystal different from the liquid crystal used for liquid crystal display. Compared with small molecule liquid crystals, liquid crystal polymer generally has high strength, high modulus, good mechanical strength and good thermal stability. Compared with other macromolecules, liquid crystal polymer having an ordered structure can form a liquid crystal polymer network through appropriate cross-linking. Here, cross-linked liquid crystal macromolecules with relatively low cross-linking degree are also called liquid crystal elastomers. CLCP combines anisotropy of liquid crystal and rubber elasticity of a high-molecular network. Therefore, it has an excellent molecular synergistic effect and can generate anisotropic deformation by changing the ordered arrangement of the liquid crystal elements, under stimulating effect of an external field (heat, light, electricity, magnetic, solvent, etc.). Compared with other stimulations, light as a source for stimulation may have an obvious advantage because it is an energy source that is clean, safe and with zero pollution, and may be controlled remotely. By introducing a photoresponsive group (e.g., azobenzene) into CLCP, CLCP may become photodeformable and capable of directly converting light energy into mechanical energy. Properties of and methods of making CLCP may be found in "A Study of Visible and Near-infrared Light-induced deformable Liquid Crystal Polymer Material", Wei W U, Ph. D Dissertation, Department of Material Science, Fudan University, Apr. 10, 2012, which is herein incorporated by reference in its entirety and referred to as "Dissertation by Wei Wu" hereinafter.

A display panel is disclosed herein according to an embodiment. The display panel comprises: a plurality of light emitters on a substrate, and a plurality of the photoelectric sensors disclosed herein on the substrate. Here, the plurality of photoelectric sensors is configured to receive light reflected from an object to perform an object surface pattern detection. For example, the object may be a finger and the plurality of photoelectric sensors is configured to receive light reflected from the finger to perform a fingerprint detection. In an embodiment, a panel having a plurality of the photoelectric sensors may provide contactless touch. In another embodiment, a panel having a plurality of the photoelectric sensors may support remote interaction using directional light sources (e.g., a laser pointer).

According to an embodiment, the display panel has a plurality of photoelectric sensors on the substrate. Each of the photoelectric sensors comprises a piezoelectric unit, and a photodeformable unit located on top of the piezoelectric unit. When fingerprint identification is needed, the side of a finger having a fingerprint may face the display panel. The light of the display panel is reflected by the finger. When the reflected light irradiates the photodeformable unit, the photodeformable unit deforms and an electric signal is generated. Then the fingerprint of the finger is captured.

A plurality of photoelectric sensors may be arranged in a display zone or a non-display zone of the display panel. In an embodiment, when a plurality of photoelectric sensors are arranged in the display zone of the display panel, each position of the display zone of the display panel can be configured to have a photoelectric sensor, so that any area of the display panel can be used to achieve fingerprint capture. To simplify the manufacturing process of the display panel, and to simplify the complexity of the internal elements or wiring of the display panel, a plurality of photoelectric sensors may also be arranged in a predefined identification zone of the display panel. The identification zone is a designated area for carrying out fingerprint capture. In an embodiment, the source of the light reflected by a finger can be the display panel. Namely, light emitted by the display panel may be reflected by a finger and irradiate the photodeformable unit. According to an embodiment, the display panel can be an organic light-emitting display panel.

Figure 4:
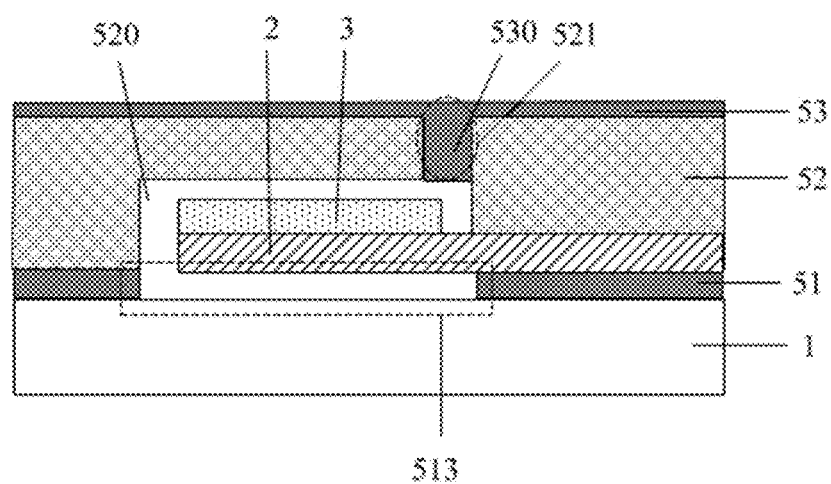
FIG. 4 schematically shows a structural diagram of an organic light emitting display device comprising a photoelectric sensor, according to an embodiment.

A display panel according to an embodiment is shown in FIG. 4. A first film layer 51 is arranged between the substrate 1 and the photoelectric sensor. The first film layer 51 has a hollow area 513. A second film layer 52 is arranged on the photodeformable unit 3. The second film layer 52 has a groove 520 on the side of the second film layer 52 facing the photodeformable unit 3. A cavity is formed by the hollow area 513 of the first film layer 51 and the groove 520 of the second film layer 52. The photodeformable unit 3 and part of the photodeformable unit 3 on which the photodeformable unit 3 is formed are in the cavity.

According to an embodiment, the second film layer 52 comprises a through hole 521 at the location of the groove 520. The through hole 521 extends from the inner bottom surface of the groove 520 to the upper surface of the second film layer 52, which is opposite to the surface facing the first film layer 51. A third film layer 53 is arranged on the second film layer 52. The third film layer 53 comprises a protrusion 530 that fills the through hole 521. In an embodiment, a light emitting device may be on top of the third film layer 53.

According to an embodiment, in the process to form the cavity structure, a sacrifice layer may be formed first at the location of the cavity structure, then etching liquid to etch the sacrifice layer may be injected into the cavity structure through the through hole, so that the sacrifice layer may be removed, and the cavity structure may be formed.

It should be noted that FIG. 4 just uses a photoelectric sensor arranged in a display panel to do schematic explanation. The disclosure is not limited by that. In an embodiment, a plurality of the photoelectric sensors may be arranged in an array. Fingerprint identification can be realized through combination of optical signals detected by the plurality of photoelectric sensors.

According to an embodiment, a cavity structure may be used to house the photoelectric sensor. When the photodeformable unit deforms, the piezoelectric unit may be caused to deform. Without the cavity structure, the photodeformable unit and the piezoelectric unit may be placed in direct contact with other parts of the photoelectric sensor. On one hand, the photodeformable unit and the piezoelectric unit are difficult to deform because they have no space around them; on the other hand, when the photodeformable unit and the piezoelectric unit deform, their deformation may cause other film layers in contact with them to deform. Thus, the display panel may be damaged. But the cavity structure in the embodiment cause the surrounding space of the photodeformable unit and the piezoelectric unit to form a gap. Namely, there is free space at the side of the photodeformable unit opposite the piezoelectric unit. There is also free space at the side of the piezoelectric sensor opposite the photodeformable unit. The arrangement of the cavity structure provides free space to accommodate shape/volume change when the photodeformable unit and the piezoelectric unit deform. Thus, damage to other parts of the photoelectric sensor can be avoided. In an embodiment, the light source of the light reflected by a finger can be a backlight source arranged on the photoelectric sensor. After the light emitted by the backlight source is reflected by the finger, the light then irradiates the photodeformable unit.

Figure 5:
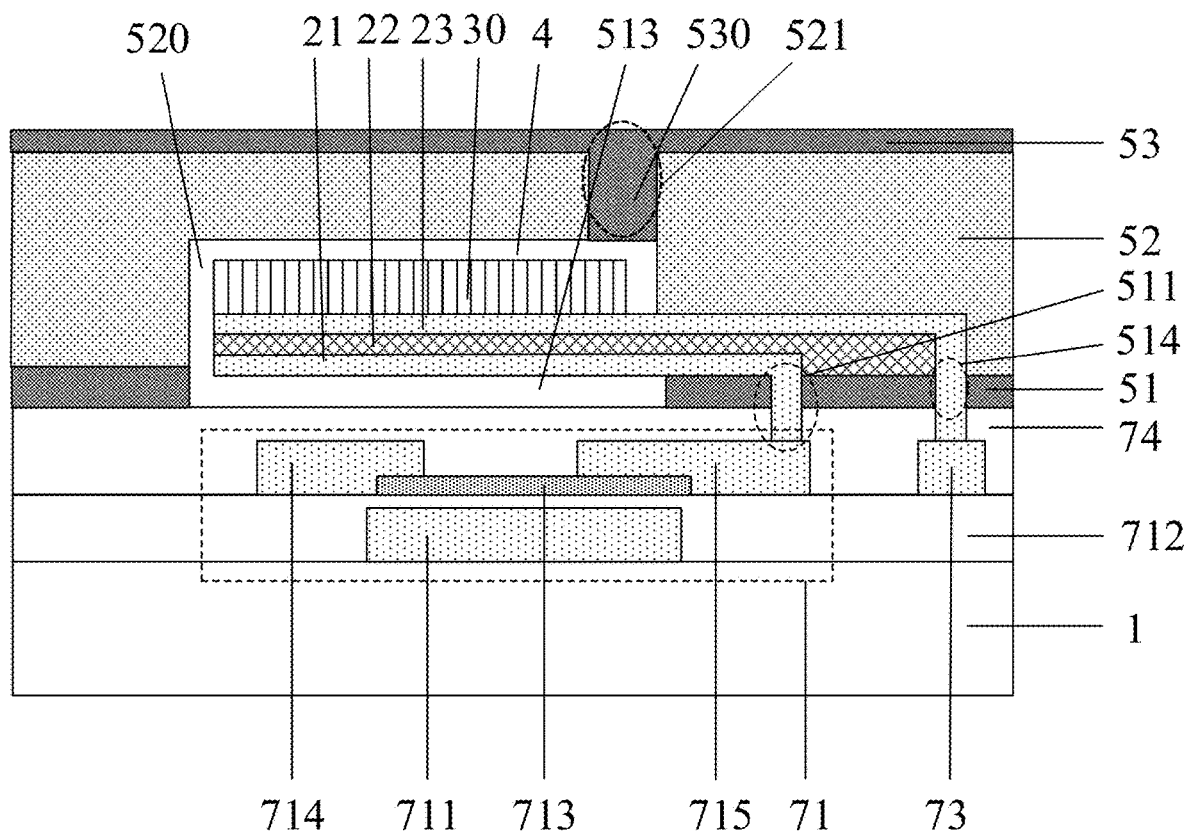
FIG. 5 schematically shows a structural diagram of an organic light emitting display device comprising a first thin film transistor, according to an embodiment.

According to an embodiment, as shown in FIG. 5, a first thin film transistor 71 is arranged between the substrate 1 and the first film layer 51. In an embodiment, the first thin film transistor 71 can be arranged below the first film layer 51. The first thin film transistor 71 may comprise a gate 711, a gate insulating layer 712 located on the gate 711, an active layer 713 located on the gate insulating layer 712, a source electrode 715 located on the active layer 713 and a drain electrode 714. The source electrode 715 of the first thin film transistor 71 is connected with the first electrode 21 (e.g., through a first via hole 511). In an embodiment, electric signal of the first electrode 21 can be conducted to an external circuit through the connection of the first via hole 511 and the first electrode 21. A second electrode lead wire 73 is arranged on a same layer of the source electrode 715 of the first thin film transistor 71. The second electrode lead wire 73 is connected with the second electrode 23. In an embodiment, electric signal of the second electrode 23 can be conducted to an external circuit through the connection of a second via hole 514 and the second electrode 23. A passivation layer 74 may be arranged on the source electrode 715 and the drain electrode 714. In an embodiment, the first film layer 51 may comprise the first via hole 511 exposing the source electrode 715 of the first thin film transistor 71, and the second via hole 514 exposing the second electrode lead wire 73.

According to an embodiment, the first thin film transistor 71 is connected to the first electrode 21 of the piezoelectric unit 2, so that the position of fingerprint identification can be pinpointed when the fingerprint identification is carried out. The second electrode lead wire 73 configured to guide out signal of the second electrode is arranged at a same layer of the source electrode 715 of the first thin film transistor 71. The manufacturing process of the display panel can be further simplified. Namely, there is no need to add a separate manufacturing step of the second electrode lead wire 73.

Figure 6:
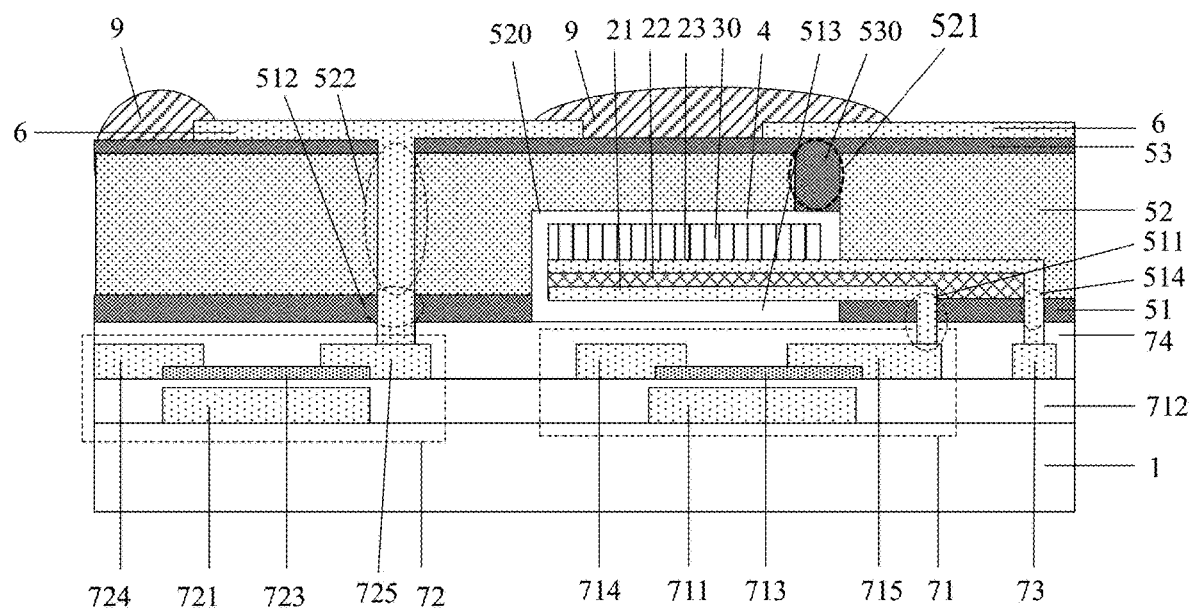
FIG. 6 schematically shows a structural diagram of an organic light emitting display device comprising a second thin film transistor, according to an embodiment.

According to an embodiment, as shown in FIG. 6, the display panel further comprises a second thin film transistor 72 on the substrate 1. The second thin film transistor 72 is configured to drive pixel units of the display panel to emit light. In the embodiment, the second thin film transistor 72 may comprise a gate 721, a gate insulating layer 722 located on the gate 721, an active layer 723 located on the gate insulating layer 722, a source electrode 725 located on the active layer 723, and a drain electrode 724. The display panel further comprises a photoelectric sensor. The photoelectric sensor comprises a piezoelectric unit 2 (in an embodiment, the piezoelectric unit 2 may comprise a first electrode 21, a piezoelectric film layer 22 located on the first electrode 21, and a second electrode 23 on the piezoelectric film layer 22), a photodeformable unit 3 located on top of the part of the piezoelectric unit 2 (the photodeformable unit 3 comprises a photodeformable film layer 30), and a cavity structure 4. In an embodiment, the display panel further comprises a first thin film transistor 71 on the substrate. The first thin film transistor 71 is configured to conduct electric signal of the photoelectric sensor to an external circuit. In an embodiment, the first thin film transistor 71 may comprise a gate 711, a gate insulating layer 712 on the gate 711, an active layer 713 on the gate insulating layer 712, a source electrode 715 on the active layer 713, and a drain electrode 714. The source electrode 715 of the first thin film transistor 71 is connected with the first electrode 21. The photoelectric sensor is arranged on the first thin film transistor. In an embodiment, the first electrode 21 can be connected with the source electrode 715 of the first thin film transistor 71 through the first via hole 511. Each film layer of the first thin film transistor 71 is arranged in a same layer of corresponding film layer of the second thin film transistor 72. Namely, the gate 711 of the first thin film transistor 71 and the gate 721 of the second thin film transistor 72 are arranged in a same layer. The active layer 713 of the first thin film transistor 71 and the active layer 723 of the second thin film transistor 72 are arranged in a same layer. The source electrode 715 and the drain electrode 714 of the first thin film transistor 71, and the source electrode 725 and the drain electrode 724 of the second thin film transistor 72 are arranged in a same layer. The display panel may also comprise a passivation layer 74, which is on top of the source electrode 715/725 and the drain electrode 714/724.

According to an embodiment, when the photoelectric sensor is arranged on the display panel, the first electrode is connected with the first thin film transistor. Namely, the detected electric signal is led out through the first thin film transistor. Each film layer of the first thin film transistor is arranged on a same layer of each corresponding film layer of the second thin film transistor which drives the pixel units of the display panel to emit light. The manufacturing process of the photoelectric sensor disclosed herein on the display panel can be simplified. Namely, there is no need to add an additional process step for manufacturing the first thin film transistor.

According to an embodiment, as shown in FIG. 6, on the side of the third film layer 53 which is far away from the substrate 1, the display panel may also comprise an anode 6 of a light emitter, and a pixel define layer 9 which separates light emitters. Here, the anode 6 is connected with the source electrode 725 of the second thin film transistor 72. The orthographic projection of the pixel define layer 9 between two adjacent anodes 6 on the substrate at least partially overlaps with the orthographic projection of the photodeformable unit on the substrate. In an embodiment, the display panel may be a top emitting structure. The anode may be a reflection anode. Namely, in FIG. 6, light is emitted in an upward direction. When a finger touches the panel, it is located above the display panel. In an embodiment, the pixel define layer may be a transparent film layer.

According to an embodiment, the display panel generally comprises a plurality of mutually independent light emitters. In an embodiment, each light emitter may comprise an anode, an organic light-emitting layer on the anode, a cathode layer on the organic light-emitting layer. When the photoelectric sensor is arranged in the display zone of the display panel, in a direction perpendicular to the substrate, the orthographic projection of the pixel define layer between two adjacent anodes on the substrate at least partially overlaps with the orthographic projection of the photodeformable unit on the substrate. Namely, each of the photoelectric sensors may be located at a gap between every two adjacent light emitters. Then, after light emitted by the display panel is reflected by a finger, the light can irradiate the photoelectric sensor through a gap between the two light emitters. Then, fingerprint identification may be performed.

Figure 7:
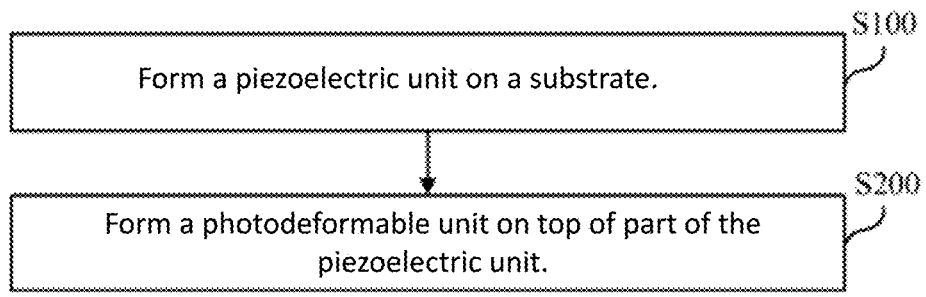
FIG. 7 schematically shows a flowchart of a manufacturing process for a display panel, according to an embodiment.

Based on the same inventive concept, as shown in FIG. 7, a method for making the display panel is disclosed herein. The method comprises:

Step S100: forming a piezoelectric unit on a substrate.

Step S200: forming a photodeformable unit on top of the piezoelectric unit.

In one embodiment, to form a photodeformable thin film, linear liquid crystal polymer Pn in tetrahydrofuran (THF) solution (e.g., 10 mg/mL) may be obtained in a first step. The THF solution with Pn may be spread on a plastic substrate (e.g., by spinning spread). Then, after the THF solution is evaporated, the Pn film may be left on the plastic substrate. The Pn film may be soaked in a solution of ethylenediamine in methanol (e.g., 0.1 lg/ml) for cross-linking reaction (e.g., for four hours). After the reaction, the film may be washed with ethanol and distilled water, and dried to obtain a photodeformable film. A detailed method to obtain the photodeformable unit is described in the Dissertation by Wei Wu.

Figure 8:
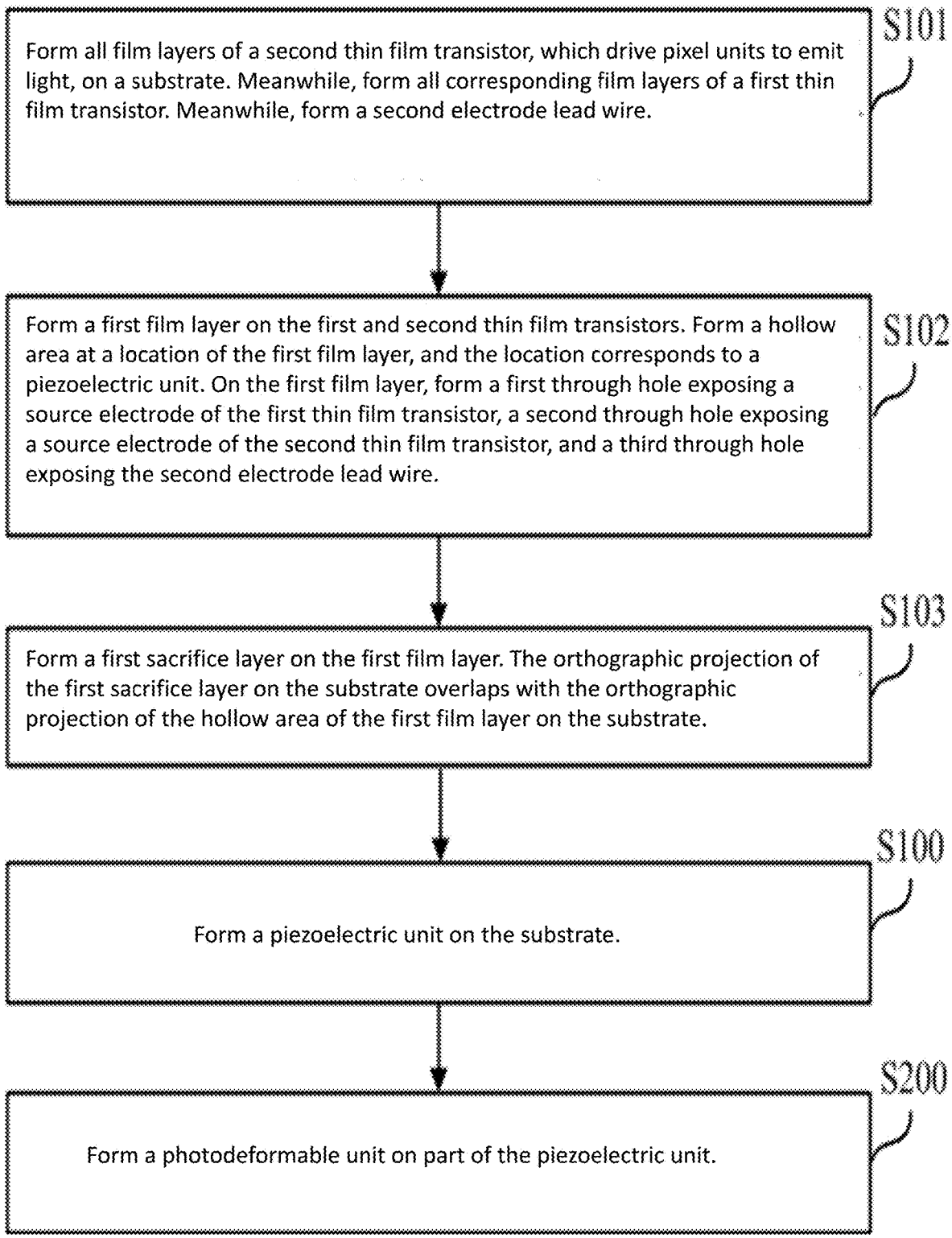
FIG. 8 schematically shows a flowchart of a manufacturing process (forming a first sacrifice layer before forming a piezoelectric unit) for a display panel, according to an embodiment.

According to an embodiment, as shown in FIG. 8, before the piezoelectric unit is formed on the substrate, the method further comprises the following steps:

Step S101: forming all film layers of the first thin film transistor and all corresponding film layers of the second thin film transistor on the substrate and forming a second electrode lead wire on the substrate. In an embodiment, the second thin film transistor may drive pixel units to emit light.

Step S102: forming a first film layer on the first and second thin film transistors. A hollow area is formed at a location of the first film layer. The location corresponds to the piezoelectric unit. On the first film layer, a first via hole exposing the source electrode of the first thin film transistor is formed, a third via hole exposing the source electrode of the second thin film transistor is formed, and a second via hole exposing the second electrode lead wire is formed;

Step S103: forming a first sacrifice layer in the hollow area. Here, the orthographic projection of the first sacrifice layer on the substrate overlaps with the orthographic projection of the hollow area of the first film layer on the substrate.

According to an embodiment, a first film layer is formed on top of the first thin film transistor and the second thin film transistor. A hollow area is formed at a location of the first film layer. The location corresponds to the piezoelectric unit. A first sacrifice layer is formed at the hollow area. At a later stage, etching liquid to etch the first sacrifice layer may be injected to the first sacrifice layer to generate the lower part of the cavity structure. Also, the first film layer and the first sacrifice layer may support the piezoelectric unit formed subsequently.

Figure 9:
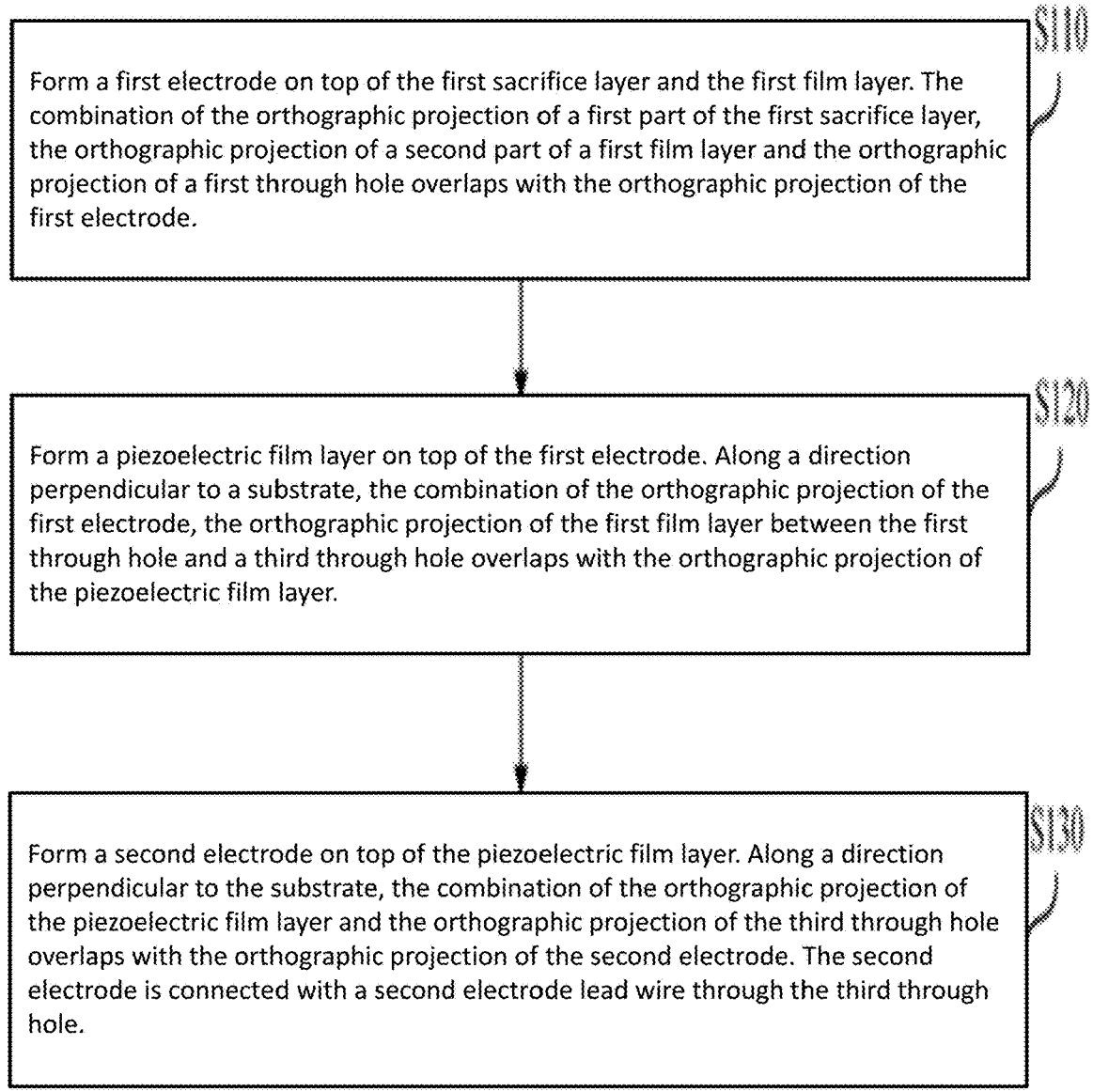
FIG. 9 schematically shows a flowchart of a specific manufacturing process for forming a piezoelectric unit, according to an embodiment.

According to an embodiment, as shown in FIG. 9, as to step S100: forming a piezoelectric unit on the substrate, it comprises:

Step S110: forming a first electrode on top of the first sacrifice layer and the first film layer. Here, the first electrode is connected with the source electrode of the first thin film transistor through the first via hole. The orthographic projection of the first electrode on the substrate only partially overlaps with the orthographic projection of the first sacrifice layer on the substrate. In an embodiment, along a direction which might be perpendicular to the substrate, the combination of the orthographic projection of a first part of the first sacrifice layer, the orthographic projection of a second part of the first film layer and the orthographic projection of the first via hole overlaps with the orthographic projection of the first electrode. Here, the first electrode is connected with the source electrode of the first thin film transistor through the first via hole. The second part is a first film layer between the hollow area and the first via hole. The first part is part of the first sacrifice layer in contact with the second part;

Here, it should be noted that: the combination of an orthographic projection of the first part of the first sacrifice layer, an orthographic projection of the second part of the first film layer and an orthographic projection of the first via hole overlaps with an orthographic projection of the first electrode. Namely, the first electrode does not fully cover the first sacrifice layer. Instead, the first electrode covers part of the first sacrifice layer which is in contact with the second part. When the first sacrifice layer is removed through etching at a later stage, if the first electrode fully covers the first sacrifice layer, the etching solution cannot be in contact with the first sacrifice layer, then the first sacrifice layer cannot be removed. Namely, along a direction perpendicular to the substrate, the first sacrifice layer and the first electrode have different positions, i.e., they are not completely aligned. So that the first sacrifice layer can be removed by etching liquid in a later stage. In an embodiment, the material of the first sacrifice layer may be zinc oxide. The etching solution may be an acidic solution;

Step S120: forming a piezoelectric film layer on top of the first electrode. In an embodiment, along a direction perpendicular to the substrate, the combination of the orthographic projection of the first electrode, the orthographic projection of the first film layer between the first via hole and the second via hole overlaps with the orthographic projection of the piezoelectric film layer;

Step S130: forming a second electrode on top of the piezoelectric film layer. Here, the second electrode is connected with the second electrode lead wire through the second via hole. In an embodiment, along a direction perpendicular to the substrate, the combination of the orthographic projection of the piezoelectric film layer and the orthographic projection of the second via hole overlaps with the orthographic projection of the second electrode.

According to an embodiment, the step S200 of forming a photodeformable unit on part of the piezoelectric unit comprises: forming a photodeformable film layer on the second electrode. Here, the orthographic projection of the photodeformable film layer on the substrate is inside the orthographic projection of the first sacrifice layer on the substrate. In an embodiment, the orthographic projection of the photodeformable film layer on the substrate may overlap with the orthographic projection of the first part of the first sacrifice layer on the substrate.

Figure 10:
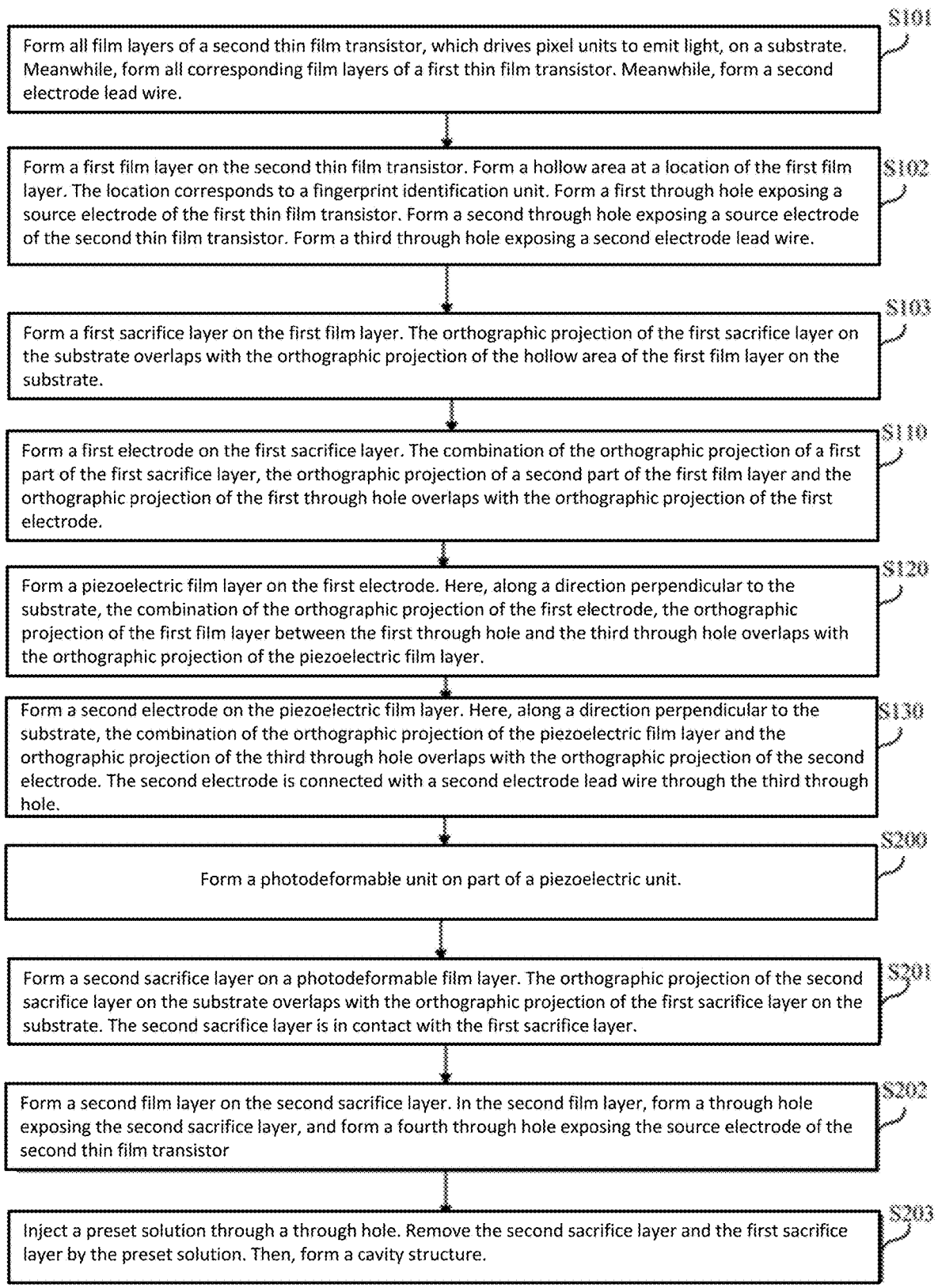
FIG. 10 schematically shows a flowchart of a manufacturing process (forming a cavity structure after forming a piezoelectric unit) for a display panel, according to an embodiment.

According to an embodiment, as shown in FIG. 10, after the photodeformable film layer is formed on the second electrode, the method further comprises:

Step S201: forming a second sacrifice layer on the photodeformable film layer. The orthographic projection of the second sacrifice layer on the substrate overlaps with the orthographic projection of the first sacrifice layer on the substrate. The second sacrifice layer is in contact with the first sacrifice layer;

Step S202: forming a second film layer on the second sacrifice layer. In the second film layer, forming a through hole exposing the second sacrifice layer and forming a via hole exposing the source electrode of the second thin film transistor;

Step S203: removing the second sacrifice layer and the first sacrifice layer to form the cavity structure. In an embodiment, a prepared solution may be injected through the through hole exposing the second sacrifice layer to etch away the second sacrifice layer and the first sacrifice layer. Thus, the cavity structure may be formed.

Figure 11:
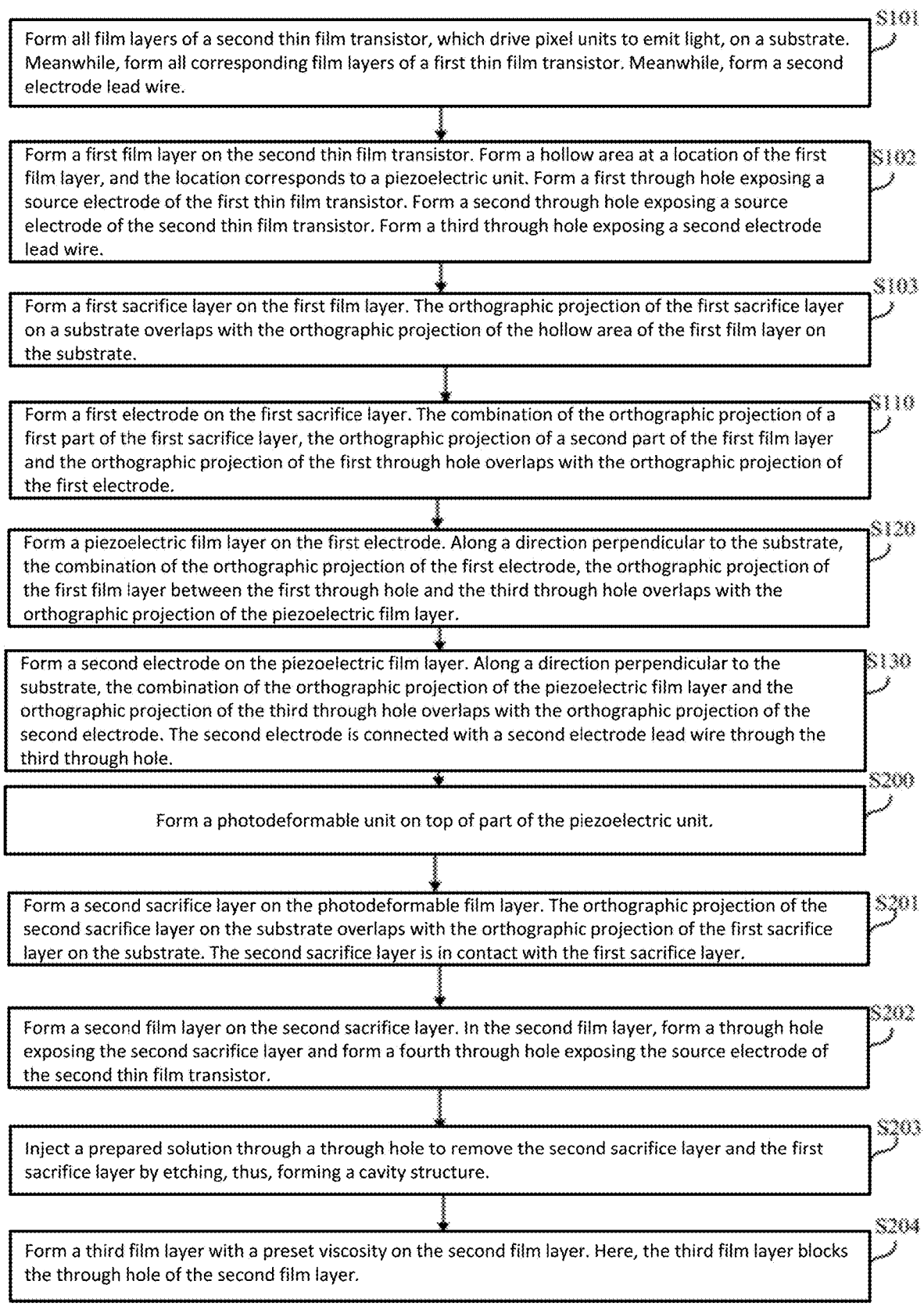
FIG. 11 schematically shows a flowchart of a manufacturing process (forming a third film layer after forming a cavity structure) for a display panel, according to an embodiment.

According to an embodiment, as shown in FIG. 11, after the second sacrifice layer and the first sacrifice layer are removed, the manufacturing method further comprises:

Step S204: forming a third film layer with a preset viscosity on the second film layer. Here, the third film layer blocks the through hole of the second film layer.

According to an embodiment, the third film layer may choose material with a relatively high viscosity, to block the through hole of the second film layer exposing the second sacrifice layer. Namely, the cavity structure is sealed at the second film layer. Due to the surface tension of the high viscosity, not too much third film layer material gets into the cavity structure.

According to an embodiment, after the third film layer with a preset viscosity is formed on the second film layer, the manufacturing method may further comprise:

Step S205: forming an anode of a patterned pixel unit on the third film layer;

Step S206, forming an organic light-emitting layer on the anode;

Step S207, forming a cathode layer on the light-emitting layer.

Figure 12:
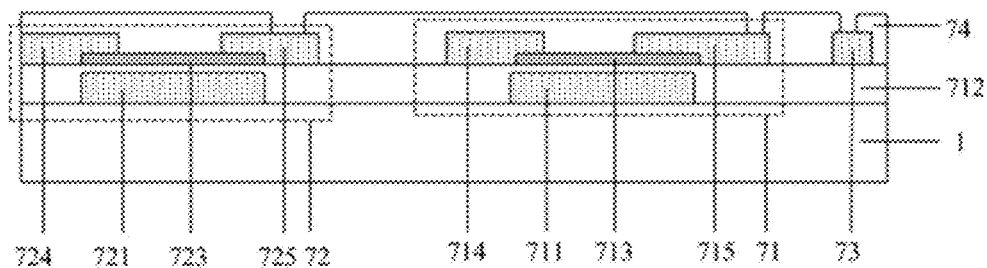
FIG. 12 schematically shows a structural diagram of a display panel after forming a thin film transistor, according to an embodiment.

In order to more clearly understand the manufacturing process of the display panel disclosed herein, according to FIGS. 12-23, detailed description is made below:

Step 1: as shown in FIG. 12, on the substrate 1, sequentially forming the gates 711 and 721, the gate insulating layers 712 and 722, the active layers 713 and 723, and the source drain electrode layer (including the source electrodes 715 and 725 and the drain electrode 714 and 724) of the first thin film transistor 71 and the second thin film transistor 72. A passivation layer 74 is formed on the source drain layer. Here, a second electrode lead wire 73 configured for leading out electrical signal of the second electrode is formed when the source drain electrode layer is formed. The passivation layer 74 comprises a via hole exposing the source electrode of the first thin film transistor 71, a via hole exposing the source electrode of the second thin film transistor 72, and a via hole exposing the second electrode lead wire 73.

Figure 13:
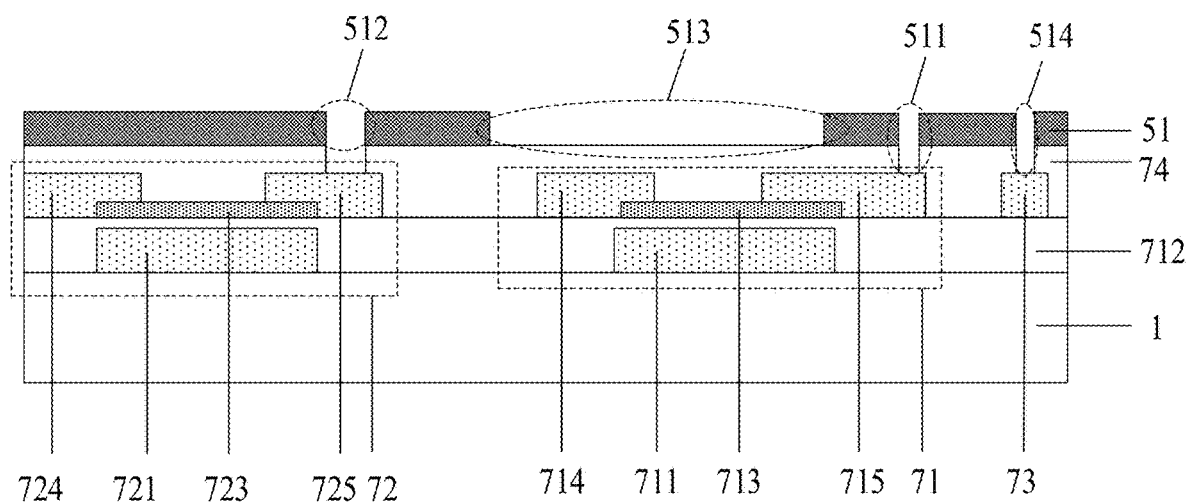
FIG. 13 schematically shows a structural diagram of a display panel after forming a first film layer, according to an embodiment.

Step 2: as shown in FIG. 13, a first film layer 51 is formed on the passivation layer 74, and a hollow area 513 is formed at a location of the first film layer 51. The location corresponds to the photoelectric sensor. A first via hole 511 exposing the source electrode 715 of the first thin film transistor 71 is formed. A third via hole 512 exposing the source electrode 725 of the second thin film transistor 72 is formed. A second via hole 514 exposing the second electrode lead wire 73 is formed. In an embodiment, the material of the first film layer 51 can be photosensitive resin. The hollow area 513, the first via hole 511, the third via hole 512 and the second via hole 514 of the first film layer can be formed through a relatively mature photoetching technology. In an embodiment, the thickness of the first film layer 51 is made according to the size of the cavity structure required, namely, the size of the gap at the side of the piezoelectric unit. The side deviates from the photodeformable unit.

Figure 14:
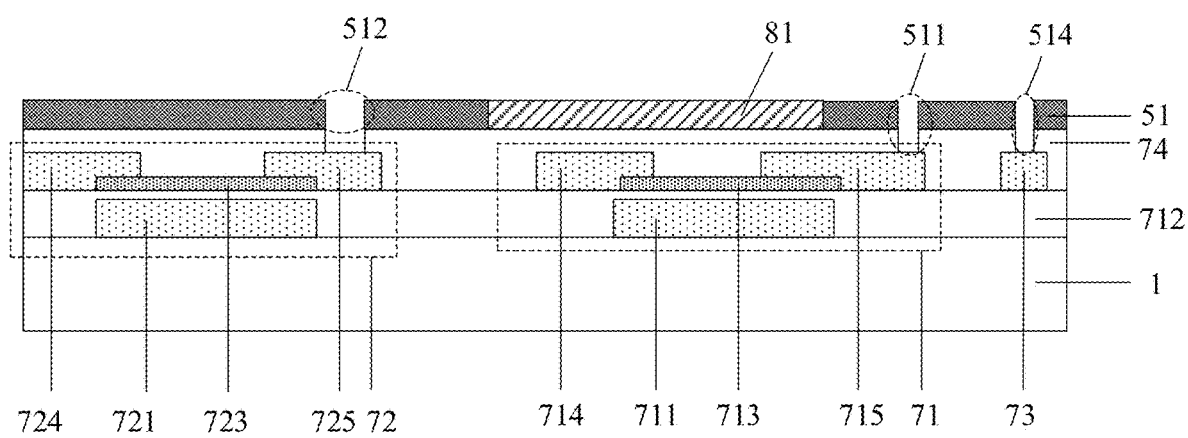
FIG. 14 schematically shows a structural diagram of a display panel after forming a first sacrifice layer, according to an embodiment.

Step 3: as shown in FIG. 14, a first sacrifice layer 81 is formed on the first film layer 51. Here, the orthographic projection of the first sacrifice layer 81 on the substrate 1 overlaps with the orthographic projection of the hollow area 513 of the first film layer 51 on the substrate 1. The manufacturing of the first sacrifice layer 81 is used for manufacturing the piezoelectric unit above the hollow structure 513 of the first film layer 51. Namely, first, the first sacrifice layer 81 for supporting each subsequent film layer of the piezoelectric unit is formed; then, through etching at a later stage, a gap can be formed on the first film layer 51 at the location of the photoelectric sensor and at a side of the piezoelectric unit that faces the substrate 1.

Figure 15:
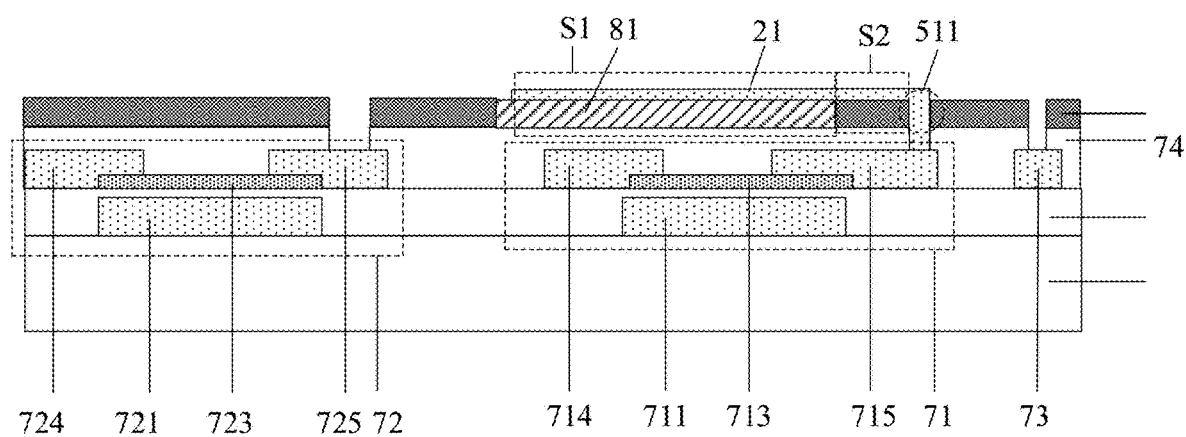
FIG. 15 schematically shows a structural diagram of a display panel after forming a first electrode, according to an embodiment.

Step 4: as shown in FIG. 15, a first electrode 21 is formed on the first sacrifice layer 81 and part of the first film layer 51. Here, along a direction perpendicular to the substrate 1, the combination of the orthographic projection of the first part 51 of the first sacrifice layer 81, the orthographic projection of the second part S2 of the first film layer 51, and the orthographic projection of the first via hole 511 overlaps with the orthographic projection of the first electrode 21. Through the first via hole 511, the first electrode 21 is connected with the source electrode 715 of the first thin film transistor 71. The second part S2 of the first film layer 51 is between the hollow area 513 and the first via hole 511. The first part 51 of the first sacrifice layer 81 is in contact with the second part S2 of the first film layer 51. It should be noted that the combination of the orthographic projection of the first part 51 of the first sacrifice layer 81, the orthographic projection of the second part S2 of the first film layer 51 and the orthographic projection of the first via hole 511 overlaps with the orthographic projection of the first electrode 21. Namely, the first electrode 21 does not fully cover the first sacrifice layers 81. Instead, the first electrode 21 covers part of the first sacrifice layer 81 that is in contact with the second part S2. When etching is used in a later stage to remove the first sacrifice layer 81, if the first electrode 21 fully covers the first sacrifice layer 81, the etching solution cannot be in contact with the first sacrifice layer 81, then, the first sacrifice layer 81 cannot be removed. Namely, along a direction perpendicular to the substrate 1, the first electrode 21 and the first sacrifice layer 81 have different positions, i.e., they are not aligned completely, so that the first sacrifice layer 81 can be removed by etching liquid in a later stage. In an embodiment, the material of the first sacrifice layer 81 may be zinc oxide. The etching liquid may be an acidic solution.

Figure 16:
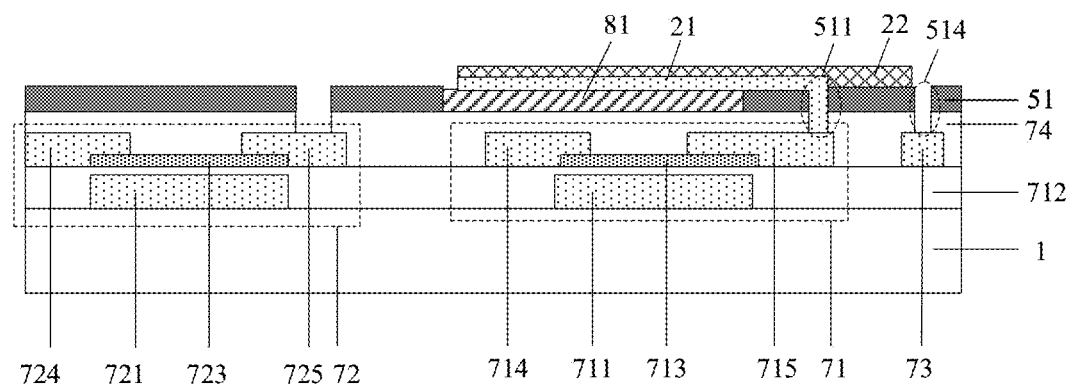
FIG. 16 schematically shows a structural diagram of a display panel after forming a piezoelectric film layer, according to an embodiment.

Step 5: as shown in FIG. 16, a piezoelectric film layer 22 is formed on the first electrode 21. Here, along a direction perpendicular to the substrate 1, the combination of the orthographic projection of the first electrode 21, the orthographic projection of the first film layer 51 between the first via hole 511 and the second via hole 514 overlaps with the orthographic projection of the piezoelectric film layer 22.

Figure 17:
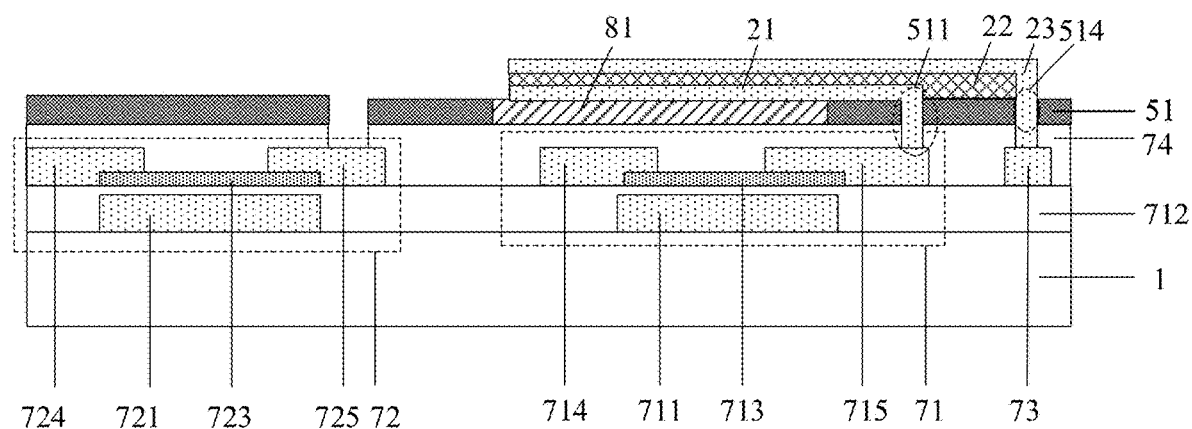
FIG. 17 schematically shows a structural diagram of a display panel after forming a second electrode, according to an embodiment.

Step 6: as shown in FIG. 17, a second electrode 23 is formed on the piezoelectric film layer 22. In a direction perpendicular to the substrate 1, the combination of the orthographic projection of the piezoelectric film layer 23 and the orthographic projection of the second via hole 514 overlaps with the orthographic projection of the second electrode 23. The second electrode 23 is connected with the second electrode lead wire 73 through the second via hole 514.

Figure 18:
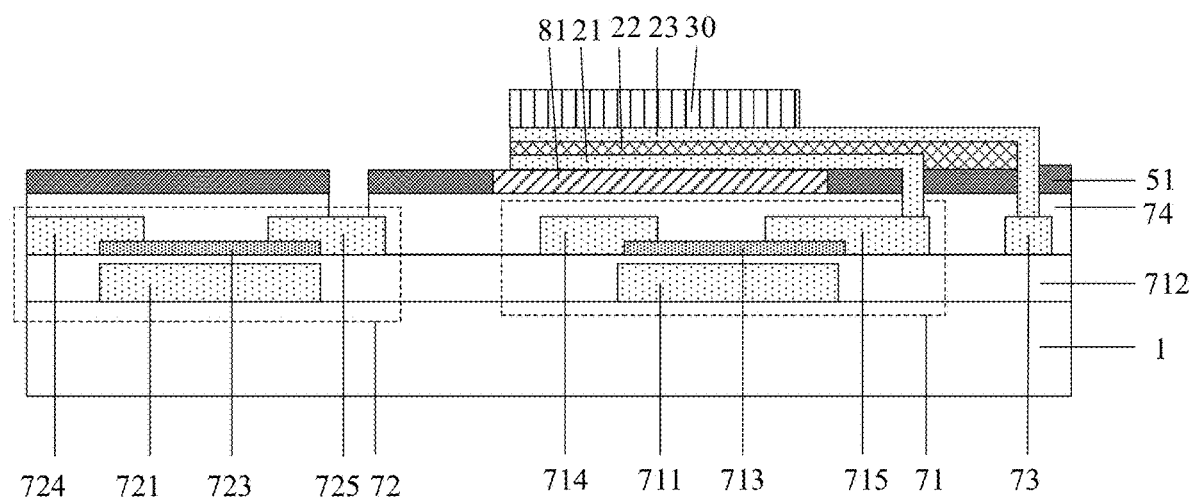
FIG. 18 schematically shows a structural diagram of a display panel after forming a photodeformable film layer, according to an embodiment.

Step 7: as shown in FIG. 18, a photodeformable film layer 30 is formed on the second electrode 23. Here, the orthographic projection of the photodeformable film layer 30 on the substrate 1 overlaps with part of the orthographic projection of the first part 51 of the first sacrifice layer 81 on the substrate 1.

Figure 19:
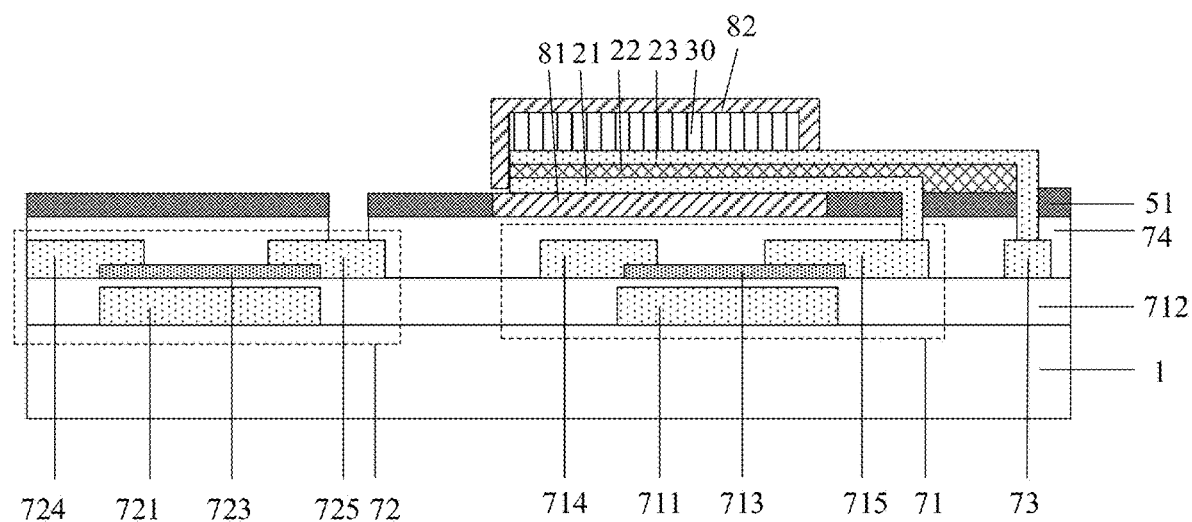
FIG. 19 schematically shows a structural diagram of a display panel after forming a second sacrifice layer, according to an embodiment.

Step 8: as shown in FIG. 19, a second sacrifice layer 82 is formed on the photodeformable film layer 30. The orthographic projection of the second sacrifice layer 82 on the substrate 1 overlaps with the orthographic projection of the first sacrifice layer 81 on the substrate 1. The second sacrifice layer 82 is in contact with the first sacrifice layer 81. In an embodiment, the second sacrifice layer 82 may cover upper surface of the photodeformable film layer 30 and cover the sides of the first electrode 21, the piezoelectric film layer 22 and the second electrode 23. In an embodiment, the material of the second sacrifice layer 82 may be the same as the material of the first sacrifice layer 81, for example, may be zinc oxide.

Figure 20:
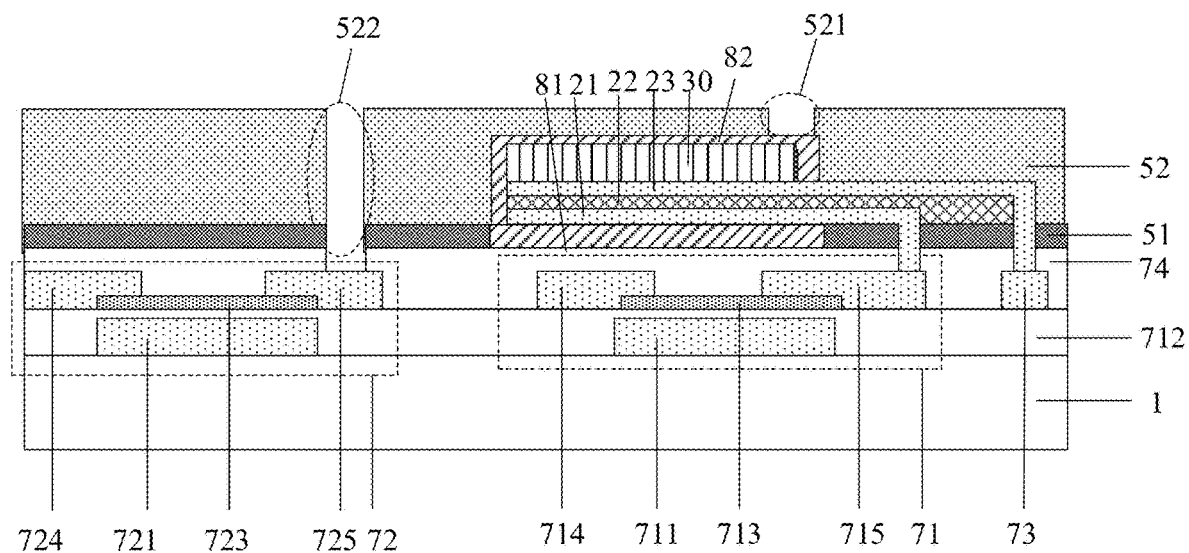
FIG. 20 schematically shows a structural diagram of a display panel after forming a second film layer, according to an embodiment.

Step 9: as shown in FIG. 20, the second film layer 52 is formed on the second sacrifice layer 82. In the second film layer 52, the through hole 521 exposing the second sacrifice layer 82 is formed, and a fourth via hole 522 exposing the source electrode 725 of the second thin film transistor 72 is formed. In an embodiment, the material of the second film layer 52 may also be photosensitive resin. The through hole 521 and the fourth via hole 522 may be formed through photoetching process. Here, the material of the first film layer 51 and the second film layer 52 are photosensitive resin. The structure of the diagram is simple. It is easy to be realized.

Figure 21:
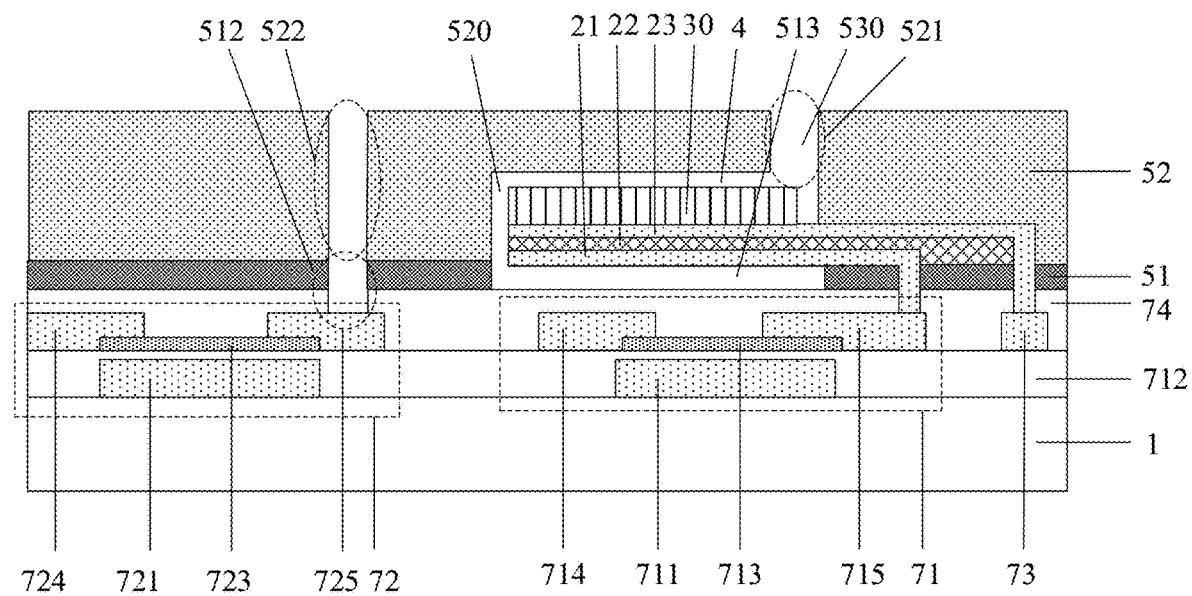
FIG. 21 schematically shows a structural diagram of a display panel after removing a first sacrifice layer and a second sacrifice layer, according to an embodiment.

Step 10: as shown in FIG. 21, a prepared solution is injected through the through hole 521, to remove the second sacrifice layer 82 and the first sacrifice layer 81 by etching. Thus the cavity structure 4 is formed. In an embodiment, when the material of the first sacrifice layer 81 and the second sacrifice layer 82 is zinc oxide, the prepared solution may be an acid solution. The whole structure may be soaked in the acid solution, and the first sacrifice layer 81 and the second sacrifice layer 82 may be etched away.

Figure 22:
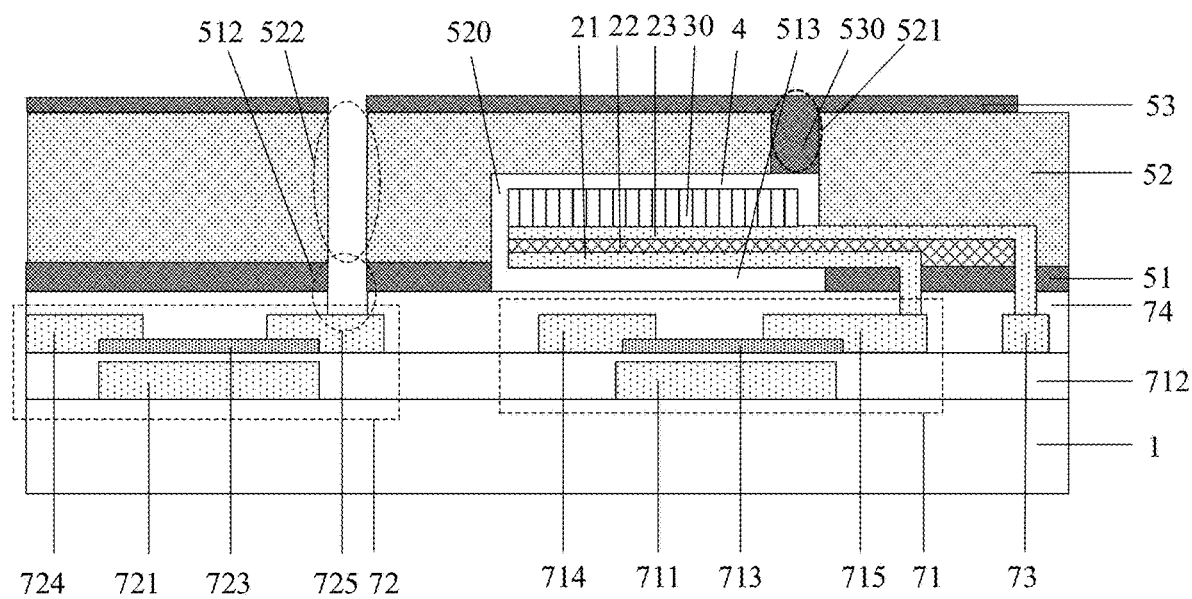
FIG. 22 schematically shows a structural diagram of a display panel after forming a third film layer, according to an embodiment.

Step 11: as shown in FIG. 22, a third film layer 53 with a preset viscosity is formed on the second film layer 52. Here, the third film layer 53 is configured for blocking the through hole 521 of the second film layer 52. In an embodiment, the third film layer may be made of material with relatively high viscosity, so that the through hole 521 of the second film layer is blocked. Namely, the cavity structure is sealed at the second film layer. Due to the surface tension of the high viscosity, not too much third film layer material may get into the cavity structure. In an embodiment, a high viscosity liquid film layer may be applied to cover the whole surface of the second film layer 52. The material for the high viscosity liquid film layer may be polyimide. Then a pattern may be formed on the high viscosity liquid film layer, e.g., by dry etching, thus forming the third film layer 53 with the protrusion 530. In an embodiment, a fifth via hole in connection with the fourth via hole 522 of the second film layer 52 may be formed on the third film layer 53.

Step 12: as shown in FIG. 6, the anodes 6 of the patterned pixel units and the pixel define layers 9 are formed on the third film layer 53.

Step 13: forming an organic light-emitting layer on the anodes.

Step 14: forming a cathode layer on the light-emitting layer.

The beneficial effect of the disclosure is: the photoelectric sensor disclosed herein comprises a piezoelectric unit, and a photodeformable unit on top of the piezoelectric unit and in contact with at least a part of the piezoelectric unit. When light irradiates the photodeformable unit, the photodeformable unit deforms. Because the piezoelectric unit is in contact with the photodeformable unit, the piezoelectric unit is caused to deform when the photodeformable unit deforms. An electric signal can be formed when the piezoelectric unit deforms. Then, the light signal can be converted into the electrical signal.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A photoelectric sensor comprising:
a photodeformable unit;
a piezoelectric unit in contact with the photodeformable unit;
a first film layer having a hollow area; and
a second film layer having a groove opening into the hollow area of the first film layer;
wherein the photodeformable unit and a first portion of the piezoelectric unit are located in the groove of the second film layer.

2. The photoelectric sensor of claim 1, wherein the piezoelectric unit comprises a first electrode, a second electrode and a piezoelectric component between the first electrode and the second electrode, wherein the photodeformable unit deforms in response to incident light and generates pressure on the piezoelectric unit and causes the piezoelectric unit to generate electrical signal(s).

3. The photoelectric sensor of claim 2, wherein the photodeformable unit comprises cross-linked liquid crystal macromolecules.

4. The photoelectric sensor of claim 1, wherein a second portion of the piezoelectric unit is sandwiched between the first film layer and the second film layer.

5. A display panel, comprising a plurality of the photoelectric sensors of claim 1 on a substrate, and further comprising one or more light emitters on the substrate, wherein the plurality of the photoelectric sensors are configured to receive light emitted from the one or more light emitters and reflected from an object to perform an object surface pattern detection.

6. The display panel of claim 5, wherein the first portion of the piezoelectric unit has no direct physical contact with the second film layer and the first film layer; and the photodeformable unit has no direct physical contact with the second film layer and the first film layer.

7. The display panel of claim 5, further comprising a plurality of first thin-film transistors each having a drain or source coupled to one of the plurality of piezoelectric units by one of a plurality of via holes of the first film layer.

8. The display panel of claim 7, further comprising a plurality of second thin-film transistors each coupled to a respective light emitter of the one or more light emitters.

9. The display panel of claim 8, further comprising a third film layer on top of the second film layer,
wherein the second film layer further comprises a plurality of through holes each opening into a respective groove of the second film layer, and
wherein the third film layer comprises a plurality of protrusions each filling a respective through hole of the second film layer.

10. The display panel of claim 9, wherein the plurality of first thin-film transistors and the plurality of second thin-film transistors are formed on a same layer on the substrate.

11. The display panel of claim 10, wherein the plurality of first thin-film transistors and the plurality of second thin-film transistors are formed between the first film layer and the substrate.

12. The display panel of claim 9, wherein each of the one or more light emitters has an anode on top of the third film layer and the display panel further comprises a pixel define layer dispersed around the anode of each of the one or more light emitters.

13. The display panel of claim 12, wherein the pixel define layer between two adjacent anodes having an orthographic projection on the substrate that at least partially overlaps with an orthographic projection of the photodeformable unit of one of the plurality the of photoelectric sensors on the substrate.

14. A method of making a display panel, comprising:
forming a piezoelectric unit on a substrate;
forming a photodeformable unit on top of and in contact with the piezoelectric unit;
forming a first thin-film transistor on the substrate;
forming a first film layer on a surface of the first thin-film transistor away from the substrate;
forming a first via hole, a second via hole and a hollow area on the first film layer; and
forming a first sacrifice layer at the hollow area, wherein the piezoelectric unit is formed partially on top of the first film layer and partially on top of the first sacrifice layer.

15. The method of claim 14, wherein forming the piezoelectric unit on the substrate further comprises:
forming a first electrode partially on top of the first film layer and partially on top of the first sacrifice layer, the first electrode being electrically coupled to a drain or source of the first thin-film transistor via the first via hole;

forming a piezoelectric component partially on top of the first electrode and partially on top of the first film layer; and forming a second electrode on top of the piezoelectric component, the second electrode being electrically coupled to an electric contact at a same layer of the first thin-film transistor via the second via hole, wherein the photodeformable unit is formed on top of the second electrode.

16. The method of claim 15, further comprising:

forming a second sacrifice layer covering the photodeformable unit and in contact with the first sacrifice layer;

forming a second film layer on top of the second sacrifice layer, the first film layer, the photodeformable unit and the piezoelectric unit;

forming a through hole in the second film layer in connection to the second sacrifice layer;

removing the first sacrifice layer and the second sacrifice layer by injecting a solution in the through hole; and forming a third film layer to cover the second film layer and block the through hole.

* * * * *